(12) United States Patent
Higgins, III et al.

(10) Patent No.: US 9,111,952 B2
(45) Date of Patent: Aug. 18, 2015

(54) SEMICONDUCTOR DEVICE

(71) Applicants: Leo M. Higgins, III, Austin, TX (US);
Sheila F. Chopin, Round Rock, TX (US)

(72) Inventors: Leo M. Higgins, III, Austin, TX (US);
Sheila F. Chopin, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 406 days.

(21) Appl. No.: 13/798,980

(22) Filed: Mar. 13, 2013

(65) Prior Publication Data
US 2014/0273352 A1  Sep. 18, 2014

(51) Int. Cl.
*H01L 21/00* (2006.01)
*H01L 21/56* (2006.01)
*H01L 23/495* (2006.01)
*H01L 21/48* (2006.01)

(52) U.S. Cl.
CPC .......... *H01L 21/565* (2013.01); *H01L 21/4842* (2013.01); *H01L 23/49548* (2013.01); *H01L 23/49582* (2013.01)

(58) Field of Classification Search
USPC ........................................... 438/123
See application file for complete search history.

(56) References Cited

U.S. PATENT DOCUMENTS

| | | |
|---|---|---|
| 5,172,214 A | 12/1992 | Casto |
| 6,838,757 B2 | 1/2005 | Abbott et al. |
| 6,949,816 B2 | 9/2005 | Brown et al. |
| 6,977,431 B1 | 12/2005 | Oh et al. |
| 7,078,271 B2 | 7/2006 | Mahle |
| 7,875,963 B1 | 1/2011 | Kim et al. |
| 7,973,394 B2 | 7/2011 | Li |

OTHER PUBLICATIONS

Possehl Electronics, "Data Sheet, QFN, Quad Flat Non-Leaded, Specification", DS-001/QFN-06-01, 1 page.
DNP Electronic Device, IC Leadfram, QFN, LF-CSP Leadframes, DNP Dai Nippon Printing Electroinc Device Operations, http://www.dnp.co.jp/semi/e/lead/06.html, pp. 1-3.

*Primary Examiner* — Marvin Payen

(57) ABSTRACT

A method includes forming a packaged integrated circuit that includes forming a lead frame by separating an outer portion of the metal structure into a plurality of leads by stamping. The plurality of leads have sides with a first concavity. The lead frame is further formed by performing an etch on the sides of the plurality of leads to achieve a second concavity on the sides of leads. The second concavity is greater than the first concavity. A semiconductor die is attached to a center portion of the metal structure. Electrical attachments are made between the die and the leads.

20 Claims, 2 Drawing Sheets

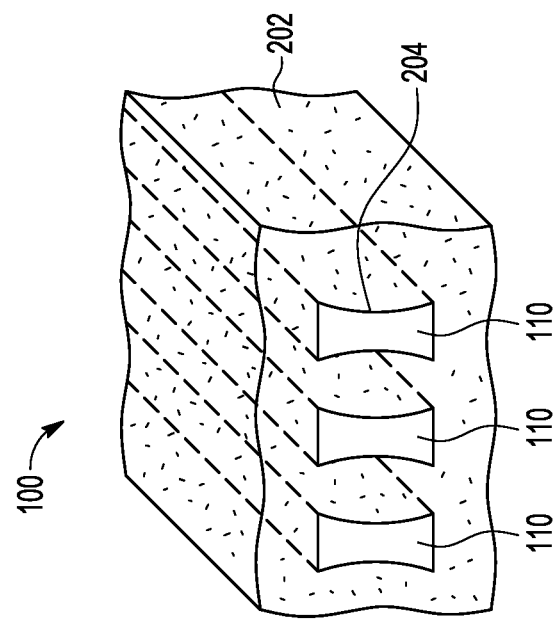
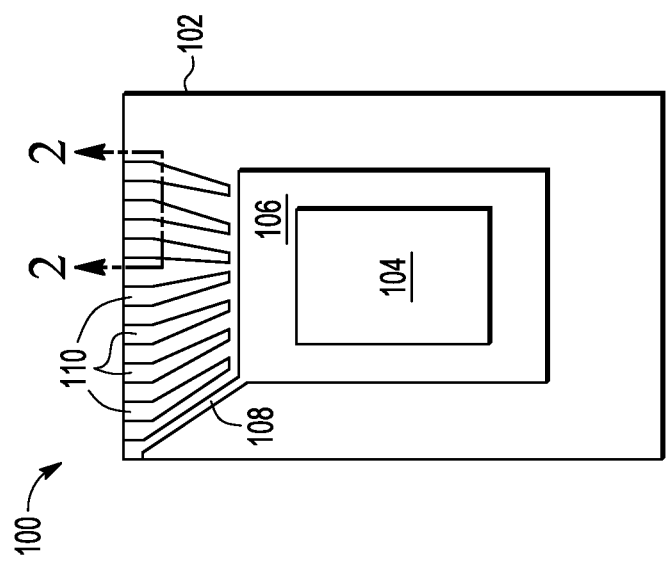
FIG. 2
FIG. 1

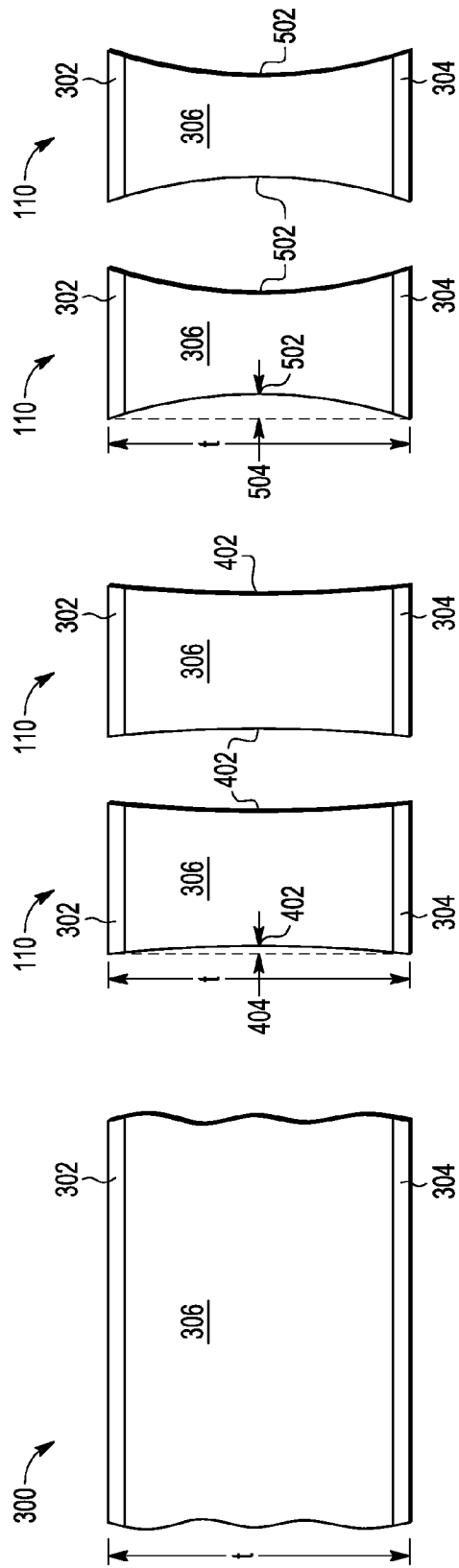

SEMICONDUCTOR DEVICE

BACKGROUND

1. Field

This disclosure relates generally to semiconductor devices, and more specifically, to semiconductor device with lead frames.

2. Related Art

Some types of packaged semiconductor devices include an integrated circuit die mounted on a lead frame. Lead frames are commonly manufactured by stamping/punching preformed sheets of metal such as copper, copper alloys, and iron-nickel alloys into desired shapes. Lead frames may also be made by plating metal in a desired pattern onto a carrier that is subsequently removed, with use of a variant of this technique called LIGA, (German acronym for Lithographie, Galvanoformung, Abformung—Lithography, Electroplating, and Molding), and other specialized techniques.

The lead frame includes conductive leads that extend from close proximity to the die to beyond the outer edges of the package body. Wire bonds are formed between the die and the lead frame to form a die assembly that connects the die to bond pads on the lead frame. The die assembly is then placed in a mold that encases the die and the wire bonds or other electrical attachments. Mold compound is inserted or injected into the mold. Mold encapsulant is formed around the die and the wire bonds to protect the die and wire bonds from corrosion, water, and external forces that may damage the die or break the wire bonds.

Environmental mandates are causing a shift away from the use of lead solder in electronic components. Use of lead-free solder has caused solder reflow temperatures to increase to approximately 260 degrees Celsius. This higher reflow temperature makes it more difficult for the mold compound to remain on the lead frame and can cause the mold compound to delaminate from the lead frame during testing and/or operational conditions. Since the semiconductor devices may be used in a variety of environmental conditions, it is desirable for the molding compound to adhere to the lead frame and other components in the package to avoid corrosion of the components due to environmental moisture and/or chemicals.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 1 is a top view of an embodiment of a semiconductor device.

FIG. 2 is a side cross-sectional view of an embodiment of leads on a portion of the lead frame of FIG. 1.

FIG. 3 is a side cross-sectional view of a portion of lead frame of FIG. 1 after a first stage of manufacture.

FIG. 4 is a side cross-sectional view of the lead frame of FIG. 3 after a subsequent stage of manufacture.

FIG. 5 is a side cross-sectional view of the lead frame of FIG. 4 after a subsequent stage of manufacture.

DETAILED DESCRIPTION

Embodiments of methods are disclosed that provide semiconductor devices with lead frames that have an increased concave shape along the edge of all exposed edges of lead frame elements such as leads, flag, tie bars, etc. The deeper concavity provides a stronger mechanical lock between the mold compound and the lead frame than is provided with typical stamped or etched lead frames. The dimensions of the concavity can be specified as a function of lead frame thickness. Deeper concavities can be used for thicker lead frames due to thermal expansion differences between the lead frame and the mold compound.

FIG. 1 is a top view of an embodiment of a semiconductor device 100 including lead frame 102 with an integrated circuit (IC) die 104 attached to flag 106. Tie bars 108 connect flag 106 to lead frame 102. Flag 106 is shown in the center of lead frame 102 and tie bars 108 extend from corners of flag 106 to respective corners of lead frame 102. Conductive leads 110 extend from close to the outer perimeter of flag 106 to the perimeter edges of lead frame 102. Lead frame 102, IC die 104, and flag 106 are shown as square shapes, but can have any suitable shapes and dimensions.

Lead frame 102 can be made by stamping and etching preformed metal sheet stock. Further, lead frame 102 can be coated with a final finish. For example, lead frame 102 can be a Pre-Plated Lead frame (PPF) plated with Ni—Pd—Au, Ni—Pd—Au/Pd, Ni—Pd—Au/Ag, etc. As another example, lead frame 102 can be a bare copper lead frame plated with silver on selected locations to enable wire bonding, and with tin after being encapsulated with a molding compound. Additionally, components with exposed leads can be coated with organic solder preservative. Other suitable configurations of lead frames 102 can be used.

FIG. 2 is a cross-sectional view of an embodiment of leads 110 on lead frame 102 of the semiconductor device 100 taken along cross-section line 2-2 of FIG. 1. Leads 110 are encapsulated by mold compound 202 and include a concave portion 204 along the sidewalls that help keep mold compound 202 adhered or physically locked to leads 110. Mold compound 202 can include a single or combined epoxy resin with a single or combined hardener, filler, adhesion promoter, curing catalyst, and flow agent.

FIG. 3 is a side cross-sectional view of a portion of metal sheet 300 during a first stage of manufacture of lead frame 102 in which metal sheet 300 is pre-formed for lead frame production. Metal sheet 300 can include a metal layer 306 with plating layers 302, 304 on upper and lower surfaces. Metal layer 306 can be formed of copper, copper alloy, or other suitable material. Plating layers 302, 304 can be formed of one or more of silver, nickel, palladium, gold, or other suitable material. Plating layers 302, 304 can be used to provide a wire bondable surface, and a solderable finish for leads 110.

Metal layer 306 can be 50 to 500 microns or other suitable thickness and plating layers 302, 304 can be formed of a layer of nickel that is 0.5 to 3 microns thick, a layer of palladium that is 0.01 to 0.05 microns thick, and a layer of gold that is 30 to 300 Angstroms thick. Other suitable thicknesses and materials can be used for metal layer 306 and plating layers 302, 304.

FIG. 4 is a side cross-sectional view of the lead frame 102 of FIG. 3 after a subsequent stage of manufacture during which lead frame 102 is stamped to remove sections of plating layers 302, 304 and metal layer 306 to form leads 110. Any suitable number of leads 110 can be formed based on the width of lead frame 102, the width of leads 110, and the number of leads required to provide connections between IC die 104 (FIG. 1) and components outside of semiconductor device 100.

When the metal sheet for lead frame 102 is stamped, shallow concave portions 402 can form in the sidewalls of leads 110 with the smallest cross-section of material near the center of metal layer 306 and the largest cross-section of material at top and bottom plating layers 302, 304. Concave portions 402 can be formed in the stamping process during which a stamp having the desired shape for lead frame 102 is repeatedly and forcefully brought into contact with the metal sheet until a piece of metal in the shape of lead frame 102 is separated from the rest of the metal sheet. The concavity depth 404 measured at the point of smallest cross-sectional thickness of lead 110 may be less than the amount of concavity desired to improve adhesion or locking of encapsulant 202 (FIG. 2) to leads 110 and other portions of lead frame 102. In other cases, the stamping process may not create a concave portion 402, or the exposed edges may have a shape that would not help mold compound adhere to lead frame 102.

FIG. 5 is a side cross-sectional view of the leads 110 of FIG. 4 during a subsequent stage of manufacture in which lead frame 102 is exposed to an etchant to create deeper concave portions 502 in the sidewalls of leads 110 and other exposed edge portions of lead frame 102, with plated layers 302, 304 acting as an etch mask. The desired depth of concave portions 502 formed on the side walls of lead frame elements can be specified as a function of the thickness (t) of lead frame 102. The depth or amount of concavity in concave portions 502 can increase with the thickness of lead frame 102 because mismatch stress due to thermal expansion that separates the mold compound from the lead frame 102 increases with increasing thickness of lead frame 102.

Any suitable etchant such as copper chloride, ferric chloride, or ammonium chloride, can be used to deepen concave portions 502. The etchant can be sprayed or deposited on the exposed edges of lead frame 102, or lead frame 102 may be immersed in the etchant. The amount of time lead frame 102 is exposed to the etchant can be proportional to the increase in the depth of concave portions 502 desired.

If the upper and lower surfaces of lead frame 102 are plated, the thickness of lead frame 102 is the thickness of the metal layer 306 plus the thickness of plating layers 302, 304. If lead frame 102 is not plated, the thickness of lead frame 102 is the thickness of metal layer 306.

In some embodiments, the sum of the maximum depth of concave portions 502 in sections of lead frame 102 with two opposing sidewalls, such as leads 110, is greater than or equal to 20 to 50% of the thickness of lead frame 102. For example, leads 110 include concave portions 502 on both sidewalls, so the sum of the concave depths 504 would be 20 to 50% of the thickness of lead frame 102.

In other embodiments, the maximum depth of concave portions 502 in sections of lead frame 102 with one sidewall, such as the periphery of flag 106, is greater than or equal to 10 to 25% of the thickness of lead frame 102.

Once the lead frame 102 is stamped and concave portions 502 are formed, lead frame 102 may be plated on exposed surfaces. In another embodiment plated layers 302, 304 may be stripped from leadframe 102 prior to this plating operation. For example, lead frame 102 may be plated with nickel, palladium, and gold, or other suitable material(s)

By now it should be apparent that there has been provided a lead frame that provides encapsulant-locking elements for all exposed edges, including the edges of flags 106, tie bars, 108 and leads 110.

In some embodiments, a method of forming a packaged integrated circuit 100), can comprise forming a lead frame 106 by separating an outer portion of the metal structure into a plurality of leads 110 by stamping. The leads can have sides 302 with a first concavity 304. An etch can be performed on the sides of the plurality of leads to achieve a second concavity 404 on the sides 402 of the plurality of leads 110. The second concavity can be greater than the first concavity. A semiconductor die 104 can be attached to a center portion of the die. Electrical attachments can be made between the die and the leads and the die can be covered.

In some aspects, the etch results in the second concavity having a depth that is at least 10 percent of a thickness (t) of the plurality of leads.

In another aspect, the etch can be performed by applying an etchant comprising one of a group consisting of copper chloride, ammonium chloride, and ferric chloride to the metal structure.

In another aspect, the electrical attachments can be made with wire bonding.

In another aspect, the covering the die can comprise applying a mold compound over the die and the electrical attachments.

In another aspect, the plating can comprise forming a layer 302, 304 of nickel, palladium, and gold over the top and bottom surfaces.

In another aspect, the layer can be formed by plating and performed prior to the separating.

In another aspect, the layer can be formed after the performing the etch and the layer of nickel, palladium, and gold can be formed on the sides of the plurality of leads.

In another aspect, the etch can comprise immersing the metal structure in a liquid etchant.

In another aspect, the encapsulating the die can comprise applying a mold over the leads that encases the die and the electrical attachments, and inserting mold compound into the mold.

In another embodiment, a method of using a metal structure 110 having a top surface and a bottom surface in forming a packaged die can comprise forming a plurality of leads on an outer portion 110 of the metal structure by stamping the metal structure. The stamping results in sides 402 of the plurality of leads having a concave shape as measured by concave depth 404. Depth 404 of the concave shape can be increased by etching. A die 104 can be attached to an inner portion 106 of the metal structure. Wire bonds can be attached between the plurality of leads and the die. The die can be covered.

In another aspect, the wire bonds can be covered.

In another aspect, the wire bonds and the die can be covered by applying a mold over the wire bonds and the die and filling the mold with mold compound.

In another aspect, increasing the depth of the concave shape can be further characterized by causing the concave shape to have a depth that is at least 10 percent of a thickness (t) of a lead of the plurality of leads.

In another aspect, increasing the depth can comprise applying an etchant to the metal structure.

In another aspect, the depth can be increased by applying an etchant comprising one of a group consisting of copper chloride, ammonium chloride, and ferric chloride to the metal structure.

In another aspect, forming the plurality of leads can be further characterized by the metal structure comprising copper having a coating comprising nickel, palladium, and gold.

In yet another embodiment, a method of forming a packaged die 100 using a metal structure 102 can comprise stamping a plurality of leads 110 from an outer portion of the metal structure 102. Sides of the plurality of leads have a concave structure 402 to a first depth 404. The leads can be etched to increase the concave structure to a second depth 504 greater than the first depth 404. A die 104 can be attached to an inner portion 106 of the metal structure. Wire bonds can be attached between the die and the plurality of leads. A mold can be placed over the die and the wire bonds. The mold can be filled with molding compound. The mold is then removed.

In another aspect, the metal structure can comprise copper with a coating 302 comprising nickel, palladium, and gold.

In another aspect, the second depth 504 can be at least 10 percent of a thickness (t) of a first lead of the plurality of leads.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a packaged integrated circuit, comprising:
   forming a lead frame by:
      separating an outer portion of the metal structure into a plurality of leads by stamping, wherein the plurality of leads have sides with a first concavity; and
      performing an etch on the sides of the plurality of leads to achieve a second concavity on the sides of the plurality of leads, wherein the second concavity is greater than the first concavity;
   attaching a semiconductor die to a center portion of the die;
   making electrical attachments between the die and the leads; and
   covering the die.

2. The method of claim 1, wherein the performing the etch results in the second concavity having a depth that is at least 10 percent of a thickness (t) of the plurality of leads.

3. The method of claim 2, wherein the performing the etch is by applying an etchant comprising one of a group consisting of copper chloride, ammonium chloride, and ferric chloride to the metal structure.

4. The method of claim 3, wherein the making electrical attachments comprises wire bonding.

5. The method of claim 4, wherein the covering the die comprises applying a mold compound over the die and the electrical attachments.

6. The method of claim 5, wherein the plating comprises forming a layer of nickel, palladium, and gold over the top and bottom surfaces.

7. The method of claim 6, wherein the forming the layer is by plating and performed prior to the separating.

8. The method of claim 6, wherein the step of forming the layer is performed after the performing the etch and further comprises forming the layer of nickel, palladium, and gold on the sides of the plurality of leads.

9. The method of claim 2, wherein the performing the etch comprises immersing the metal structure in a liquid etchant.

10. The method of claim 1, wherein the encapsulating the die comprises:
    applying a mold over the leads that encases the die and the electrical attachments; and
    inserting mold compound into the mold.

11. A method of using a metal structure having a top surface and a bottom surface in forming a packaged die, comprising:
    forming a plurality of leads on an outer portion of the metal structure by stamping the metal structure, wherein the stamping results in sides of the plurality of leads having a concave shape;
    increasing a depth of the concave shape by etching;
    attaching a die to an inner portion of the metal structure;
    attaching wire bonds between the plurality of leads and the die; and
    covering the die.

12. The method of claim 11, further comprising covering the wire bonds.

13. The method of claim 12, wherein the covering the wire bonds and the covering the die is achieved by applying a mold over the wire bonds and the die and filling the mold with mold compound.

14. The method of claim 11, wherein the increasing the depth of the concave shape is further characterized by causing the concave shape to have a depth that is at least 10 percent of a thickness (t) of a lead of the plurality of leads.

15. The method of claim 14, wherein the increasing the depth comprises applying an etchant to the metal structure.

16. The method of claim 15, wherein the increasing the depth is by applying an etchant comprising one of a group consisting of copper chloride, ammonium chloride, and ferric chloride to the metal structure.

17. The method of claim 11, wherein the forming the plurality of leads is further characterized by the metal structure comprising copper having a coating comprising nickel, palladium, and gold.

18. A method of forming a packaged die using a metal structure, comprising:
    stamping a plurality of leads from an outer portion of the metal structure, wherein sides of the plurality of leads having a concave structure to a first depth;
    etching the plurality of leads to increase the concave structure to a second depth greater than the first depth;

attaching a die to an inner portion of the metal structure;
attaching wire bonds between the die and the plurality of leads;
placing a mold over the die and the wire bonds;
filling the mold with molding compound; and
removing the mold.

19. The method of claim 18, wherein metal structure comprises copper with a coating comprising nickel, palladium, and gold.

20. The method of claim 18, wherein the second depth is at least 10 percent of a thickness (t) of a first lead of the plurality of leads.

\* \* \* \* \*